United States Patent
Sakamoto et al.

(10) Patent No.: US 12,063,743 B2
(45) Date of Patent: Aug. 13, 2024

(54) PRINTED CIRCUIT BOARD

(71) Applicant: NICHIA CORPORATION, Anan (JP)

(72) Inventors: Masakazu Sakamoto, Tokushima (JP);
Masaaki Katsumata, Anan (JP);
Tomohisa Kishimoto, Anan (JP)

(73) Assignee: NICHIA CORPORATION, Anan (JP)

( * ) Notice: Subject to any disclaimer, the term of this patent is extended or adjusted under 35 U.S.C. 154(b) by 36 days.

(21) Appl. No.: 17/873,144

(22) Filed: Jul. 26, 2022

(65) Prior Publication Data

US 2022/0369466 A1 Nov. 17, 2022

Related U.S. Application Data

(62) Division of application No. 16/584,952, filed on Sep. 27, 2019, now Pat. No. 11,439,019.

(30) Foreign Application Priority Data

Sep. 28, 2018 (JP) .................................. 2018-185935

(51) Int. Cl.
*H05K 1/18* (2006.01)
*H05K 1/02* (2006.01)
(Continued)

(52) U.S. Cl.
CPC ........... *H05K 1/184* (2013.01); *H05K 1/0283* (2013.01); *H05K 1/188* (2013.01); *H05K 3/10* (2013.01);
(Continued)

(58) Field of Classification Search
CPC ...... H05K 1/0283; H05K 1/113; H05K 1/118; H05K 1/184; H05K 1/188; H05K 1/189; H05K 2201/0979
See application file for complete search history.

(56) References Cited

U.S. PATENT DOCUMENTS

| | | |
|---|---|---|
| 7,178,233 B2 | 2/2007 | Nakamura et al. |
| 9,668,352 B2 | 5/2017 | Wang et al. |

(Continued)

FOREIGN PATENT DOCUMENTS

| | | |
|---|---|---|
| JP | 2000-260934 | 9/2000 |
| JP | 2002-270718 | 9/2002 |

(Continued)

OTHER PUBLICATIONS

Restriction Requirement issued by the U.S. Patent and Trademark Office for the U.S. Appl. No. 16/584,952, filed Mar. 10, 2021.
(Continued)

*Primary Examiner* — Minh N Trinh
(74) *Attorney, Agent, or Firm* — MORI & WARD, LLP

(57) ABSTRACT

A printed circuit board includes a printed wiring board including an insulative substrate having a first surface and a second surface opposite to the first surface, and wiring provided on the second surface of the insulative substrate to face the through-holes. The insulative substrate has flexibility and through-holes passing through the insulative substrate from the first surface to the second surface. A semiconductor element is mounted on the first surface of the insulative substrate of the printed wiring board and has element terminals interposed between the printed wiring board and the semiconductor element. Conductive members filled in the through-holes connect the element terminals and the wiring. The insulative substrate has elasticity in which an elongation percentage of the insulative substrate is 20% or more. The wiring is formed from a conductive polymer or an elastic conductive paste in which conductive particles are mixed into a resin material.

15 Claims, 10 Drawing Sheets

(51) Int. Cl.
*H05K 3/10* (2006.01)
*H05K 3/32* (2006.01)
*H05K 3/42* (2006.01)
*H05K 3/46* (2006.01)

(52) U.S. Cl.
CPC ............... *H05K 3/32* (2013.01); *H05K 3/425* (2013.01); *H05K 3/4611* (2013.01); *H05K 2201/10106* (2013.01)

(56) References Cited

U.S. PATENT DOCUMENTS

| | | | | |
|---|---|---|---|---|
| 11,439,019 | B2* | 9/2022 | Sakamoto | H05K 1/188 |
| 2002/0127839 | A1 | 9/2002 | Umetsu et al. | |
| 2003/0060000 | A1 | 3/2003 | Umetsu et al. | |
| 2011/0240357 | A1* | 10/2011 | Kariya | H05K 1/181 |
| | | | | 174/266 |
| 2012/0181560 | A1 | 7/2012 | Hiramatsu et al. | |
| 2015/0179905 | A1 | 6/2015 | Ohmae et al. | |
| 2017/0231094 | A1* | 8/2017 | Blackshear | H05K 1/185 |
| 2018/0097165 | A1 | 4/2018 | Marutani | |
| 2022/0369466 | A1* | 11/2022 | Sakamoto | H05K 1/184 |

FOREIGN PATENT DOCUMENTS

| | | |
|---|---|---|
| JP | 2006-269583 | 10/2006 |
| JP | 2010-103164 | 5/2010 |
| JP | 2012-151191 | 8/2012 |
| JP | 2015-144254 | 8/2015 |
| JP | 2017-098314 | 6/2017 |
| JP | 2017-112312 | 6/2017 |
| JP | 2017-143257 | 8/2017 |
| JP | 2018-060841 | 4/2018 |

OTHER PUBLICATIONS

Office Action with Form PTO-892 Notice of References Cited issued by the U.S. Patent and Trademark Office for the U.S. Appl. No. 16/584,952, filed May 14, 2021.

Office Action with Form PTO-892 Notice of References Cited issued by the U.S. Patent and Trademark Office for the U.S. Appl. No. 16/584,952, filed Jan. 31, 2022.

Notice of Allowance issued by the United States Patent and Trademark Office for the U.S. Appl. No. 16/584,952, filed Apr. 27, 2022.

* cited by examiner

PRINTED CIRCUIT BOARD

CROSS-REFERENCE TO RELATED APPLICATIONS

The present application is a divisional application of the U.S. patent application Ser. No. 16/584,952, filed on Sep. 27, 2019, which issued as U.S. Pat. No. 11,439,019, and which claims priority under 35 U.S.C. § 119 to Japanese Patent Application No. 2018-185935, filed on Sep. 28, 2018. The contents of these applications are hereby incorporated by reference in their entirety.

BACKGROUND OF THE INVENTION

Field of the Invention

The present disclosure relates to a printed circuit board and a method of manufacturing the same.

Discussion of the Background

In recent years, with respect to printed circuit boards (PCBs), bendable flexible printed circuit (FPC) boards each having a sheet shape, which are mounted while being housed in, for example, a narrow space or a deformed portion in an electronic apparatus have been developed. In addition, elastic FPC boards that are elastic have been developed mainly for wearable devices. Those circuit boards each uses a printed wiring board (PWB) in which a wiring pattern is printed on a surface of an insulative film having flexibility and elasticity with a conductive paste.

In contrast with the flexible printed wiring boards, semiconductor elements (chips, dies) and semiconductor devices sealing those elements with resin, which are to be mounted, have high rigidity, and therefore those do not follow deformation of the flexible printed wiring boards. Hence there is a risk in which, when the printed wiring boards are deformed, stress concentrates on bonding parts with terminals (outer leads) of the semiconductor devices, and the bonding parts are damaged, leading to a conduction failure. Accordingly a conductive adhesive achieving rigid bonding has been developed (refer to Japanese Unexamined Patent Application Publication No. 2017-112312). In addition, a printed circuit board having a configuration that bores holes in a printed wiring board at two positions interposing a mounting region of a semiconductor device and adjacent to the mounting region to avoid concentration of stress on the mounting region has been developed (refer to Japanese Unexamined Patent Application Publication No. 2017-98314).

SUMMARY OF THE INVENTION

According to one aspect of the present invention, a printed circuit board includes a printed wiring board, a semiconductor element, and conductive members. The printed wiring board includes an insulative substrate having a first surface and a second surface opposite to the first surface, and wiring provided on the second surface of the insulative substrate to face the through-holes. The insulative substrate has flexibility and through-holes passing through the insulative substrate from the first surface to the second surface. The semiconductor element is mounted on the first surface of the insulative substrate of the printed wiring board and has element terminals interposed between the printed wiring board and the semiconductor element. The conductive members filled in the through-holes connect the element terminals and the wiring. The insulative substrate has elasticity in which an elongation percentage of the insulative substrate is 20% or more. The wiring is formed from a conductive polymer or an elastic conductive paste in which conductive particles are mixed into a resin material.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DESCRIPTION OF THE EMBODIMENT

Figure 1:
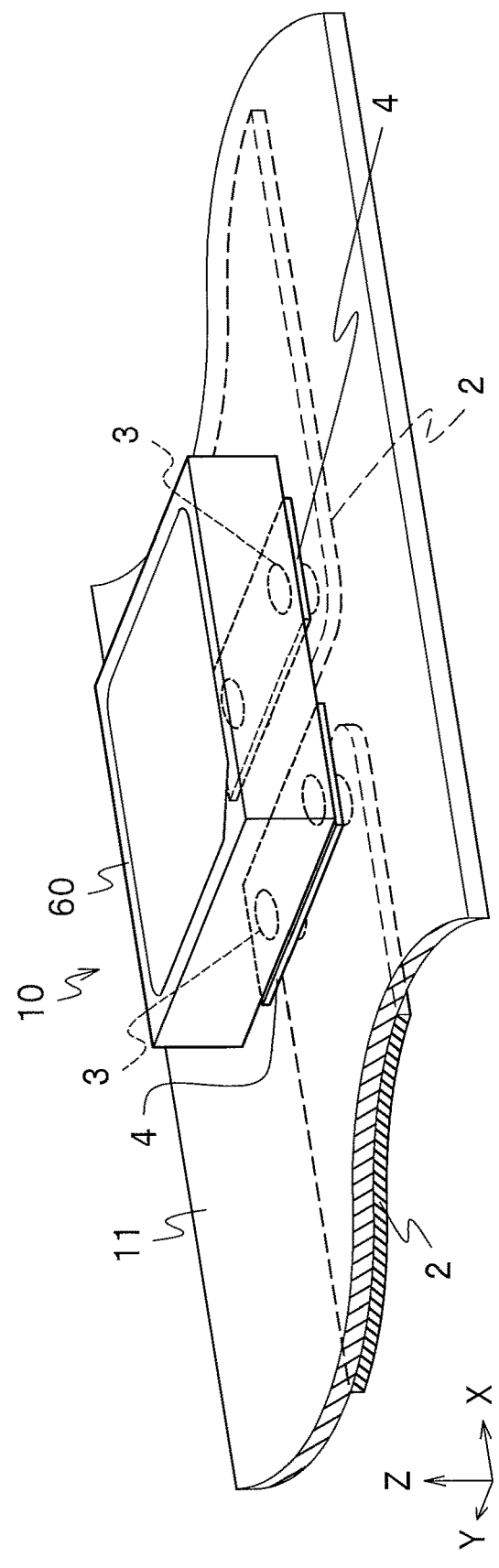
FIG. 1 is a schematic enlarged perspective view illustrating a configuration of a printed circuit board according to an embodiment.

The embodiments will now be described with reference to the accompanying drawings, wherein like reference numerals designate corresponding or identical elements throughout the various drawings.

In the conductive adhesive according to Japanese Unexamined Patent Application Publication No. 2017-112312, although its adhesive strength is strong, wiring on the printed wiring board, which is bonded to the conductive adhesive, may be broken by a load caused by stress concentration. In the printed circuit board according to Japanese Unexamined Patent Application Publication No. 2017-98314, complete elimination of a load on the mounting region interposed between the holes is difficult, and when rigidity of the mounting region is increased with, for example, a bonding member so as to prevent the mounting region from being deformed, there is a risk in which the printed wiring board is broken from an edge of the hole.

The present embodiment has an object for providing a highly reliable printed circuit board having flexibility and elasticity.

Hereinafter, a printed circuit board and a method of manufacturing the same will be described with reference to the drawings. The drawings referred in the following description schematically illustrate the embodiment of the present disclosure, and therefore sizes, positional relationships, and the like of members illustrated in the drawings may be exaggerated, and further shapes thereof may be simplified. Further, in some drawings, an observation direction is indicated by using XYZ coordinate axes for convenience of description. Specifically, an X axis, a Y axis orthogonal to the X axis, and a Z axis orthogonal to both the X axis and the Y axis are defined. For example, a plane passing through the X axis and the Y axis is referred to as an X axis-Y axis plane, and the X axis-Y axis plane corresponds to a board surface of the printed circuit board. Unless otherwise specifically noted, a plane means the X axis-Y axis plane. Further, in the following description, the same name and sign generally indicate an identical or homogeneous member, and description thereof is omitted as appropriate.

Printed Circuit Board

Figure 2A:
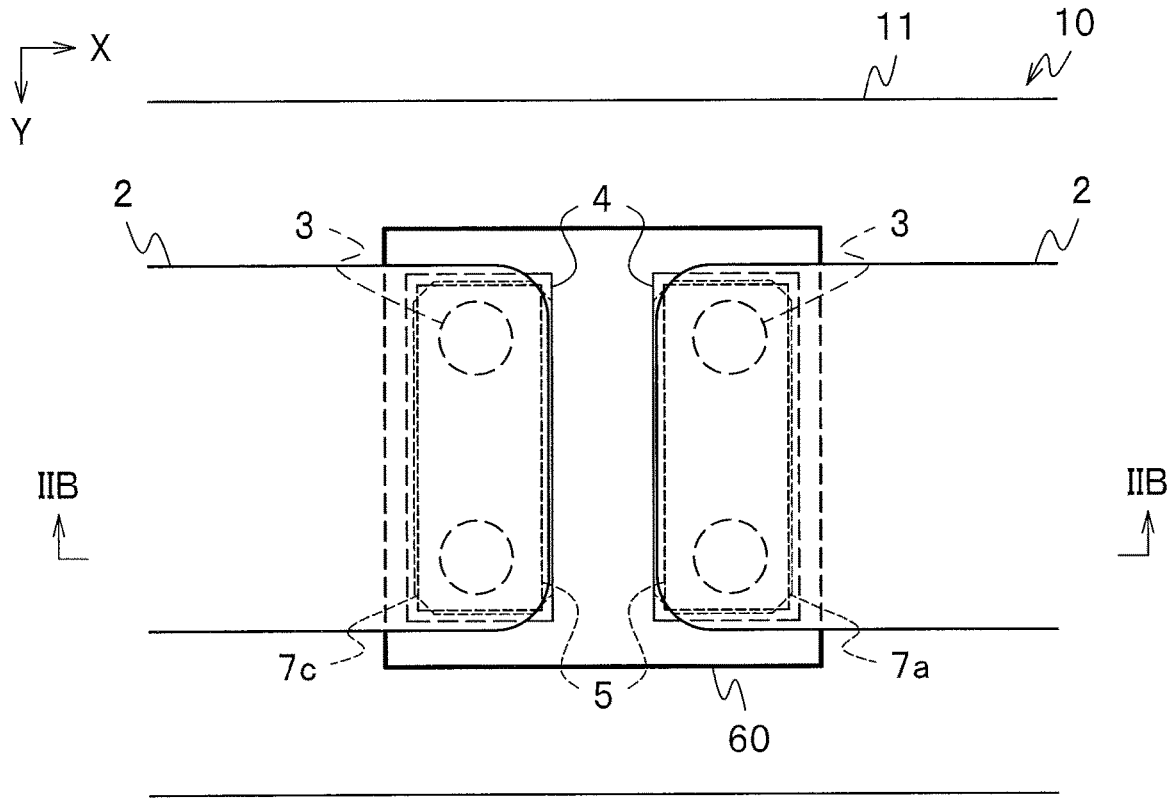
FIG. 2A is a schematic enlarged bottom view illustrating the configuration of the printed circuit board according to the embodiment.
Figure 2B:
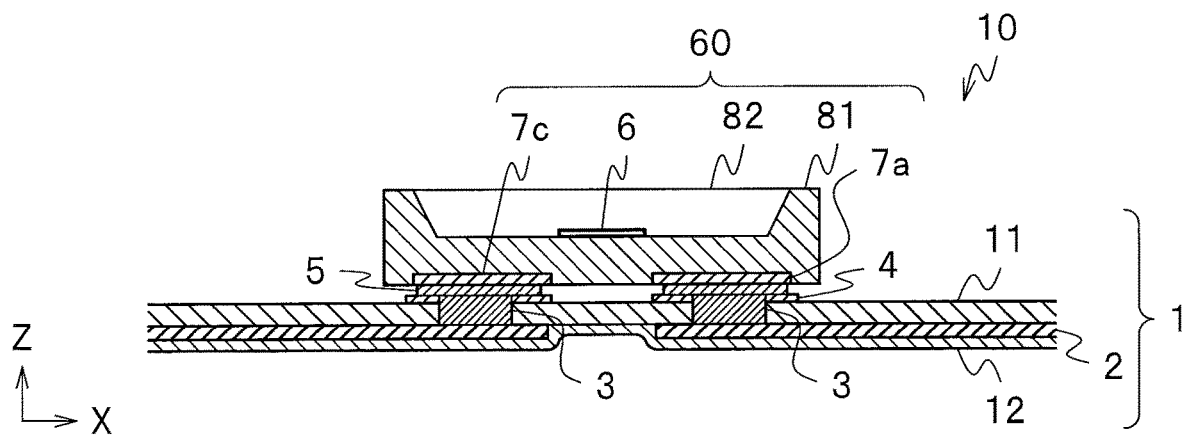
FIG. 2B is a schematic cross-sectional view taken along line IIB-IIB in FIG. 2A.
Figure 3A:
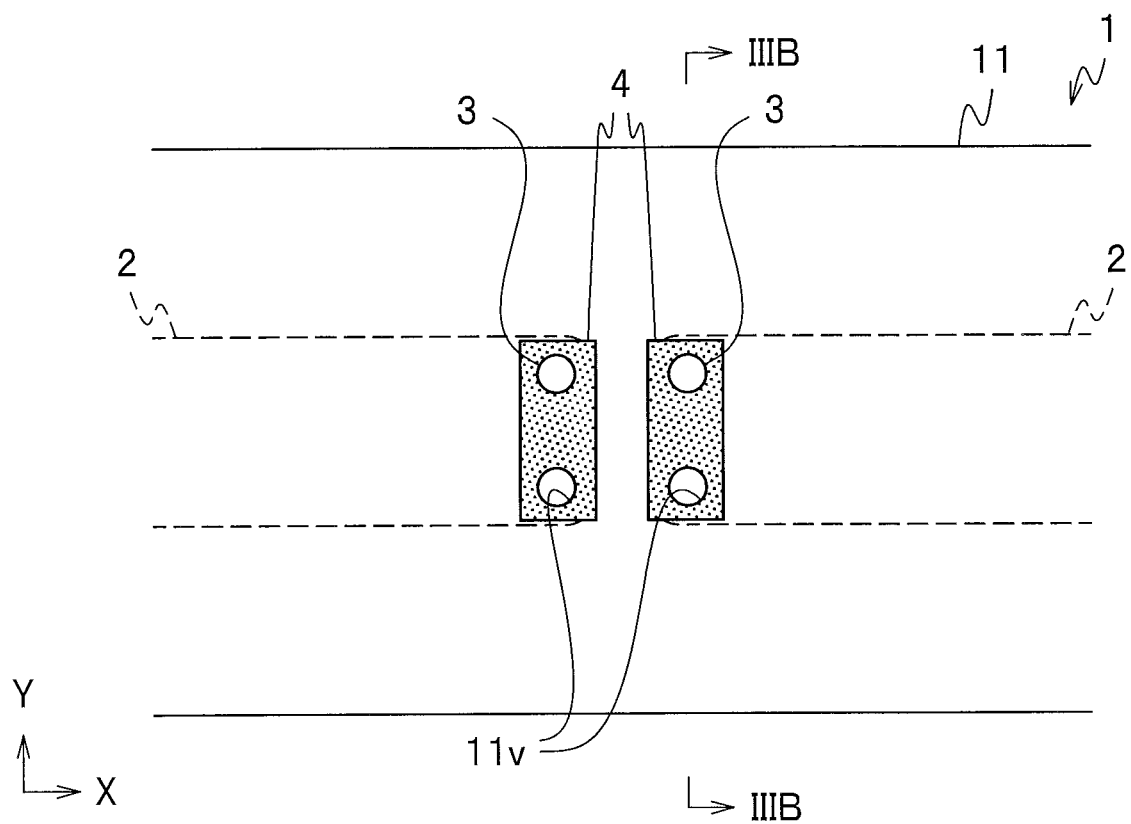
FIG. 3A is a schematic plan view illustrating a configuration of a printed wiring board of the printed circuit board according to the embodiment.
Figure 3B:
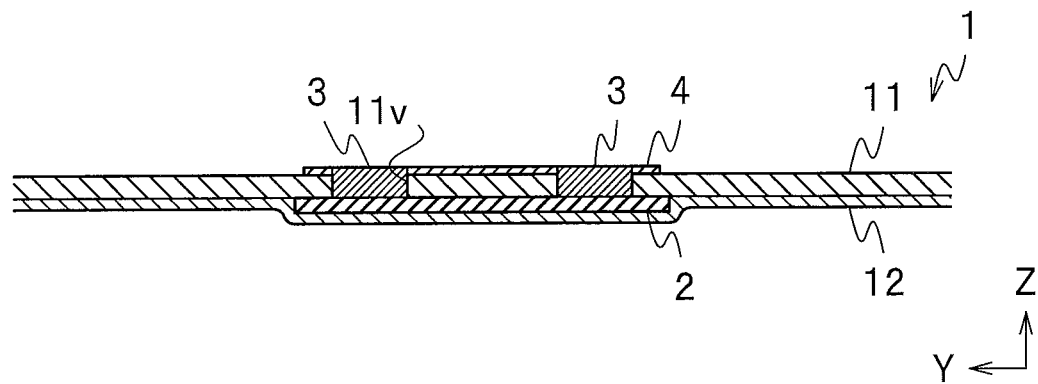
FIG. 3B is a schematic cross-sectional view taken along line IIIB-IIIB in FIG. 3A.

A configuration of a printed circuit board will be described with reference to FIG. 1, FIGS. 2A, 2B, and FIGS. 3A, 3B. FIG. 1 is a schematic enlarged perspective view illustrating a configuration of the printed circuit board according to the embodiment. FIG. 2A is a schematic enlarged bottom view illustrating the configuration of the printed circuit board according to the embodiment. FIG. 2B is a schematic cross-sectional view taken along line IIB-IIB in FIG. 2A. FIG. 3A is a schematic plan view illustrating a configuration of a printed wiring board of the printed circuit board according to the embodiment. FIG. 3B is a schematic cross-sectional view taken along line IIIB-IIIB in FIG. 3A.

A printed circuit board 10 is an elastic circuit applied to, for example, a wearable device such as a biosensor. The printed circuit board 10 has a light emitting device 60 disposed thereon having a semiconductor light emitting element on a part of a mounted electronic component. The printed circuit board 10 includes a printed wiring board 1 that has wiring 2 disposed on a surface of an insulative substrate 11 having flexibility, and a light emitting device 60 that is a semiconductor element to be mounted on the printed wiring board 1 through leads 7a, 7c that are element terminals with bonding members 5. The printed wiring board 1 includes vias 11v that are through-holes respectively corresponding to the leads 7a, 7c of the light emitting device 60 in the substrate 11. The printed wiring board 1 is provided with wiring 2 in regions facing the vias 11v on a lower surface, and the leads 7a, 7c are connected to the wiring 2 through conductive members 3 filled in the vias 11v. Further, in the printed circuit board 10, the printed wiring board 1 includes pads 4 that are metal films in regions immediately below respective leads 7a, 7c on an upper surface of the printed circuit board 10. The leads 7a, 7c are bonded to the pads 4 with bonding members 5, respectively. Note that, in FIG. 2A, assuming that the substrate 11 is transparent, illustration is made so as to show the pads 4 and the light emitting device 60 disposed on an upper side (a deep side of the paper) of the substrate 11. In the printed circuit board 10, although the portion mounting the single light emitting device 60 is illustrated herein, a plurality of light emitting devices or an electronic component such as an integrated circuit (IC) for causing the light emitting device 60 to light or blink may be mounted besides the single light emitting device 60. Hereinafter, configurations of members will be described in detail.

Light Emitting Device

The light emitting device 60 is a surface-mounted light emitting device that includes a semiconductor light emitting element (hereinafter, a light emitting element) 6 therein, and is provided with the lead 7a (anode electrode) and the lead 7c (cathode electrode) on its lower surface. The light emitting device 60 is formed into a thin rectangular parallelepiped shape. The light emitting device 60 mounts the light emitting element 6 on a package member formed with a resin molded body 81 including the leads 7a, 7c and a recess, and a light-transmissive member 82 is formed in the recess of the resin molded body 81 so as to seal the light emitting element 6.

For the light emitting element 6, for example, a light emitting diode (LED) of any luminescent color can be selected according to an application of the light emitting device 60 on the printed circuit board 10. For example, the light emitting element 6 is an InGaN-based nitride semiconductor such as $In_xAl_yGa_{1-X-Y}N$ ($0 \leq X \leq 1$, $0 \leq Y \leq 1$, $X+Y \leq 1$), as a blue light emitting element having a luminescence peak at a wavelength ranging from 430 nm to 470 mm.

The leads 7a, 7c are each formed from a metal plate such as a copper alloy or a plating film, are exposed on an inner side of the package member and on a lower surface on an outer side of the package member while being supported by resin molded body 81, and are connected to a pair of electrodes of the light emitting element 6 with regions (inner leads) exposed on the inner side of the package member. In the leads 7a, 7c, regions (outer leads) exposed on the outer side of the package member, that is, on the lower surface of the light emitting device 60 are bonded to the pads 4 and conductive members 3 of printed wiring board 1, respectively. Therefore, for example, the leads 7a, 7c are disposed to be aligned along an X direction while being spaced from each other on the lower surface of the light emitting device 60. Furthermore, each of the leads 7a, 7c is formed into a rectangular shape long along a Y direction so as to secure a sufficient connection area on the lower surface of the light emitting device 60. In addition, four corners of the rectangular shape are diagonally cut out.

The resin molded body 81 is a base that forms an exterior of the light emitting device 60 to support the light emitting element 6 and the leads 7a, 7c. The resin molded body 81 is formed from an insulation member to insulate the lead 7a and the lead 7c from each other. Further, the resin molded body 81 is formed from a light reflecting material to effectively emit light upward. The resin molded body 81 is formed with a recess that opens in an upwardly expanded manner, to involve the light emitting element 6 therein. The resin molded body 81 can be formed from a material prepared by adding a light reflective material such as titanium oxide ($TiO_2$) to resin such as a silicone resin, a modified silicone resin, an epoxy resin, a modified epoxy resin, an acrylic resin, or a hybrid resin containing at least one kind of those resins.

The light-transmissive member 82 is a sealing member that is filled into the recess of the package member (resin molded body 81) and seals the light emitting element 6 to protect the light emitting element 6 from an external environment. The light-transmissive member 82 is formed from a material that is insulative and transmits light, such as a silicone resin, an epoxy resin, or a urea resin. The light-transmissive member 82 may include a fluorescent material. Note that, assuming that the light-transmissive member 82 is transparent, only a contour line of the light-transmissive member 82 is illustrated in FIG. 2B.

Printed Wiring Board

The printed wiring board 1 is a film-shaped printed wiring board having flexibility and elasticity, and includes a substrate 11, the wiring 2 that is formed from a conductive film and is formed with a pattern on a lower surface of the substrate 11, the pads 4 that are formed from a metal film and are formed in a mounting region of the light emitting element on an upper surface of the substrate 11, the conductive member 3 that is filled into the vias 11v in which the corresponding pad 4 has a through-hole communicating with the through-hole of the substrate 11 and whose lower end is connected to the wiring 2, and a protective film 12 that entirely covers a lower surface of the printed wiring board 1. Note that the protective film 12 is illustrated in FIG. 2B and schematic cross-sectional views described later, and is omitted in other drawings. The printed wiring board 1 has an elongation percentage according to an application of the printed circuit board 10. When the printed circuit board 10 is applied to, for example, a wearable device, the elongation percentage is set to be 10% (1.1 times an initial length) or more, is preferably set to be 20% or more, is more preferably set to be 50% or more, and is yet more preferably set to be 80% or more.

The substrate 11 is a film-shaped insulation member that supports the wiring 2, the pads 4, and all other members of the printed wiring board 1. The substrate 11 has thermal resistance against heat generated from the light emitting element 6 and thermal resistance against a temperature upon, for example, forming the wiring 2, and is formed from an insulation material having elasticity. The temperature upon, for example, forming the wiring 2 is a burning temperature when the wiring 2 is formed from, for example, a conductive paste, and is a curing temperature of the bonding member 5 that bonds the light emitting element 6 to the wiring 2 in other cases. Resin having high elasticity is applied to a material of the substrate 11. The material of the substrate 11 is, for example, elastomer such as silicone-based polymer such as polydimethylsiloxane or urethane-based polymer. The substrate 11 is formed with a thickness having, for example, required strength and flexibility according to its material, and specifically, is preferably formed with a thickness ranging from 0.01 mm to 1 mm. An elongation percentage of the substrate 11 is preferably 20% (1.2 times an initial length) or more, is more preferably 50% or more, and is yet more preferably 80% or more. On the other hand, when the elasticity of the substrate 11 is excessively high, the substrate 11 may cause, for example, rupture or exfoliation because other members such as the wiring 2 cannot follow the substrate 11. Therefore the elongation percentage of the substrate 11 is preferably 900% (10 times an initial length) or less, is more preferably 400% or less, and is yet more preferably 200% or less.

In the substrate 11, the vias 11v are formed at four positions immediately below the light emitting device 60 in the printed wiring board 1. The conductive member 3 is filled in each via 11v. At least one via 11v is provided at each of the leads 7a, 7c of the light emitting device 60, and a plurality of vias 11v are preferably provided at each of the leads 7a, 7c. Further, vias 11v are preferably disposed immediately below each of the leads 7a, 7c. In the printed wiring board 1, four vias 11v in total are provided such that two are at the lead 7a and two are at the lead 7c. To prevent the substrate 11 from being broken from an edge of the via 11v when the printed wiring board 1 is stretched, a shape of the via 11v in plan view is preferably a circle, an oval, an ellipse, or a round square, for example. To be easily filled with the conductive member 3 and to secure reliability of the conductive member 3, a diameter of the via 11v is preferably more than or equal to a minimum wiring width in the printed wiring board 1, and is preferably more than or equal to a total thickness of the substrate 11 and the pad 4. In addition, to prevent the substrate 11 from being broken, a gap between the via 11v and via 11v is preferably more than or equal to a thickness of the substrate 11. Further, in plan view, the vias 11v are preferably disposed to be point symmetry taking a center of gravity of an external shape of the light emitting device 60 as a point of symmetry.

The wiring 2 is a conductive film that partially covers a surface of the substrate 11, and is configured to be deformed or to be stretched and contracted following the substrate 11. The wiring 2 is formed on a lower surface (a surface opposite to the mounting surface of the light emitting device 60) of the printed wiring board 1. To achieve such a configuration, the wiring 2 is formed from an elastic conductive paste in which carbon conductive particles or metal such as silver or copper is mixed into a highly elastic resin material that can be applied to the substrate 11, or a conductive polymer such as polyethylenedioxythiophene or polystyrene sulfonic acid. Those materials are printed or applied on the substrate 11, thereby forming the pattern on the substrate 11. To electrically connect the wiring 2 to each of the leads 7a, 7c of the light emitting device 60, the wiring 2 is formed at regions involving the vias 11v on the lower surface of the substrate 11.

The conductive member 3 is a columnar member filled in each via 11v of the substrate 11, and causes the wiring 2 that covers the lower surface of the substrate 11 and the leads 7a, 7c of the light emitting device 60 mounted on the upper surface of the substrate 11 to be electrically connected to each other. The conductive member 3 is a conductive adhesive used when an electronic component is mounted on a printed wiring board, which can be cured at a heat resisting temperature of, for example, the substrate 11 or less. Specifically, the conductive member 3 is, for example, a conductive paste of a low-temperature curing type, which is made by mixing metal particles such as silver or copper into a resin material.

The pad 4 is a metal film provided on an upper surface of the printed wiring board 1, the upper surface serving as a surface on which the light emitting device 60 is mounted. The pad 4 is a region (land) that is formed from a conductor so that the bonding member 5 is stuck to the surface and is provided to cause the printed wiring board 1 to hardly deform near the conductive member 3. The pad 4 is disposed according to disposition and shapes of the leads 7a, 7c of the light emitting device 60, and is formed into a rectangular shape having substantially the same size as each of the leads 7a, 7c. The pad 4 has through-holes with the corresponding via 11v of the substrate 11, and is filled with the conductive member 3 similarly to the substrate 11. The pad 4 is preferably formed from metal foil such as copper foil.

The protective film 12 is a cover lay to protect the wiring 2, and is disposed if necessary. The protective film 12 is configured to have elasticity similarly to the substrate 11, and the same insulation material as the substrate 11 can be applied to the protective film 12.

Bonding Member

The bonding member 5 is a conductive adhesive for mounting the light emitting device 60 on the printed wiring board 1. A conductive paste or a solder paste with a low melting point, which is similar to the above-described conductive member 3 and has high adhesivity with the conductive member 3 and the leads 7a, 7c of the light emitting device 60, is applied to the bonding member 5. The bonding member 5 is preferably disposed between the leads 7a, 7c of the light emitting device 60 and the pads 4 of the printed wiring board 1 with a wider area.

Method of Manufacturing Printed Circuit Board

Figure 4:
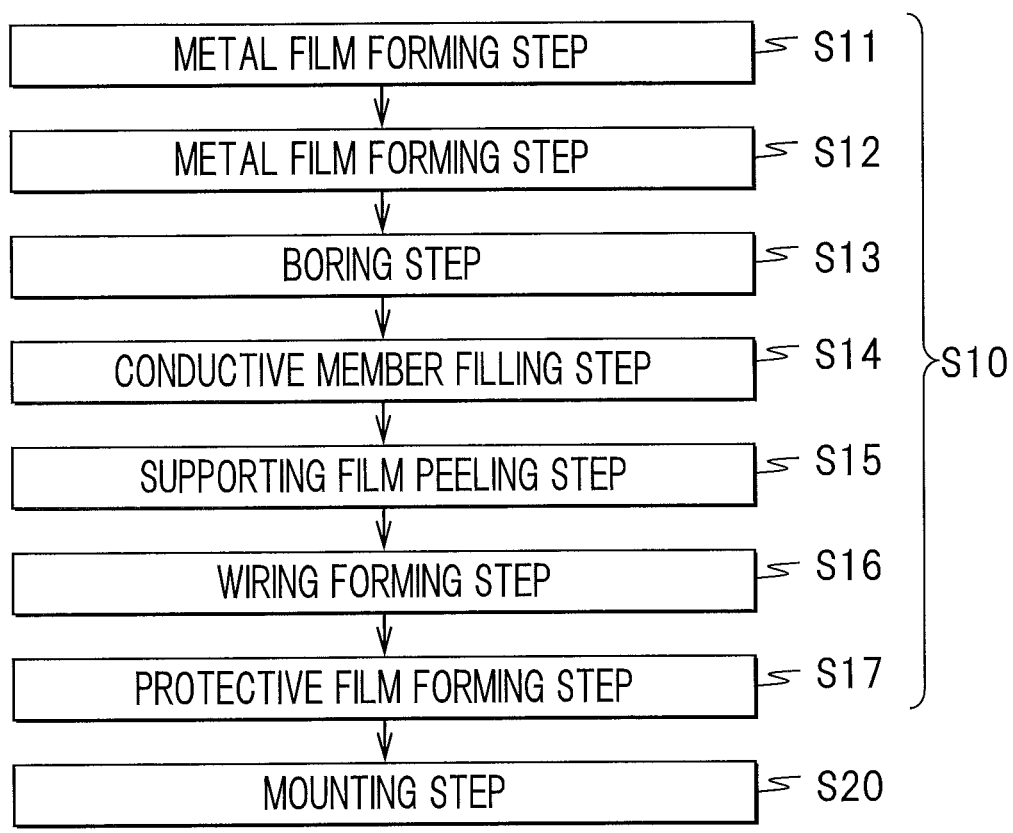
FIG. 4 is a schematic flowchart illustrating a flow of a method of manufacturing the printed circuit board according to the embodiment.
Figure 5A:
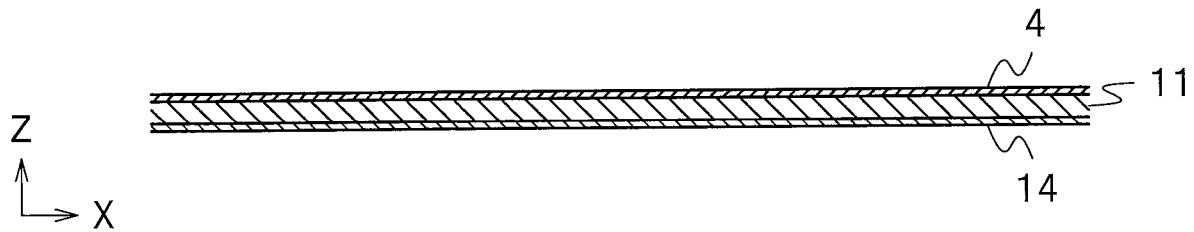
FIG. 5A is a schematic explanatory view of a metal film forming step in the manufacturing method of the printed circuit board according to the embodiment, and is a schematic enlarged cross-sectional view illustrating a state in which a metal film is provided on one surface of a substrate.
Figure 5B:
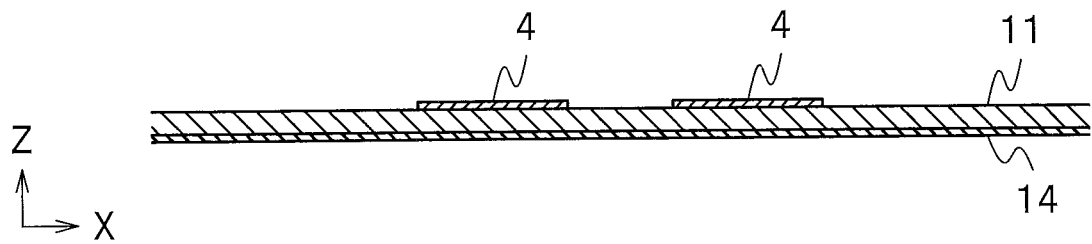
FIG. 5B is a schematic explanatory view of the metal film forming step in the manufacturing method of the printed circuit board according to the embodiment, and is a schematic enlarged cross-sectional view illustrating a state in which the metal film on the substrate is formed into a predetermined shape.
Figure 5C:
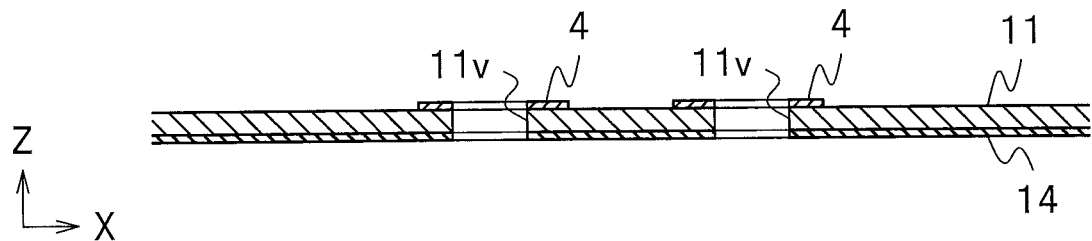
FIG. 5C is a schematic explanatory view of a boring step in the manufacturing method of the printed circuit board according to the embodiment, and is a schematic enlarged cross-sectional view illustrating a state in which the metal film has a through-hole communicating with the through-hole of the substrate to form a via.
Figure 5D:
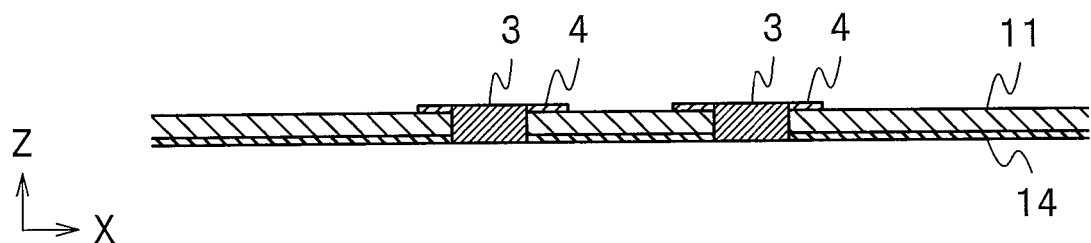
FIG. 5D is a schematic explanatory view of a conductive-member filling step in the manufacturing method of the printed circuit board according to the embodiment, and is a schematic enlarged cross-sectional view illustrating a state in which a conductive member is filled in the vias in which the metal film has a through-hole communicating with the through-hole of the substrate.
Figure 5E:
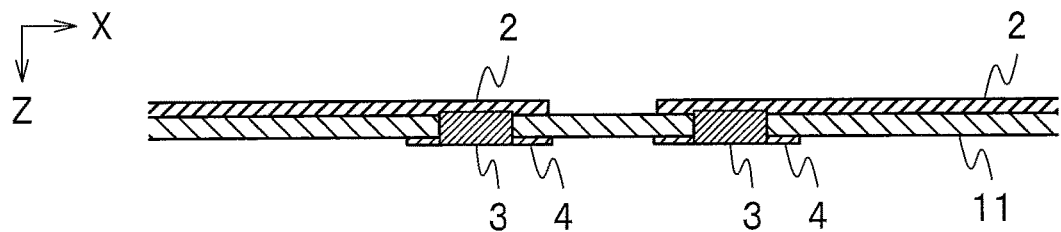
FIG. 5E is a schematic explanatory view of a wiring forming step in the manufacturing method of the printed circuit board according to the embodiment, and is a schematic enlarged cross-sectional view illustrating a state in which wiring is formed on the other surface of the substrate.
Figure 5F:
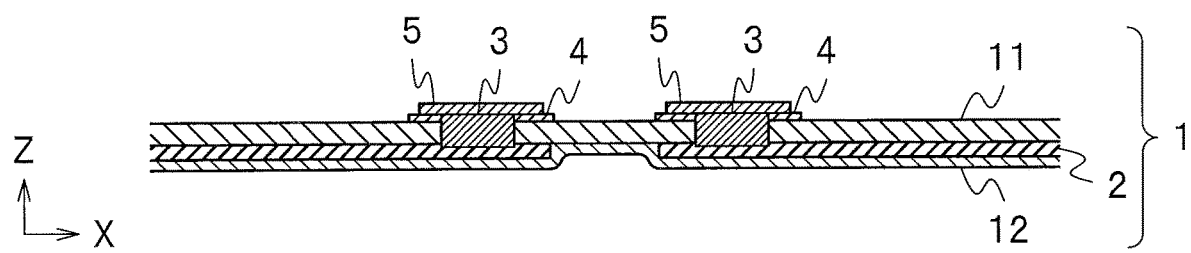
FIG. 5F is a schematic explanatory view of a mounting step in the manufacturing method of the printed circuit board according to the embodiment, and is a schematic enlarged cross-sectional view illustrating a state in which conductive bonding members are stuck to the printed wiring board.
Figure 5G:
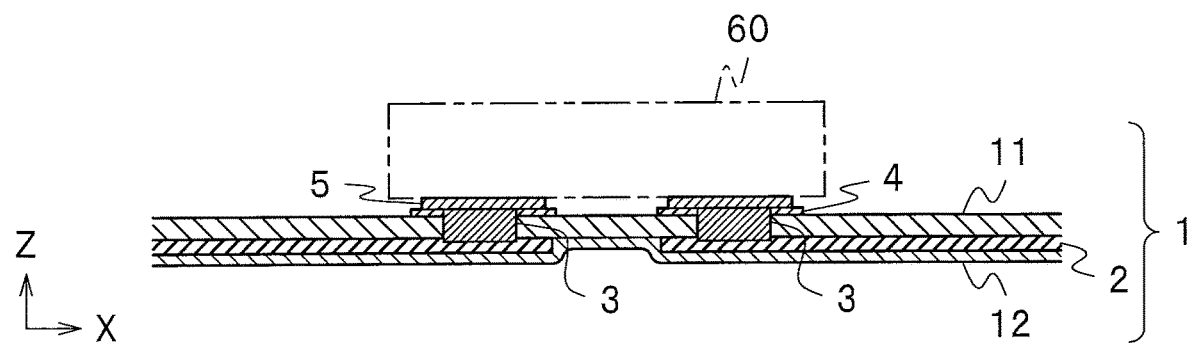
FIG. 5G is a schematic explanatory view of the mounting step in the manufacturing method of the printed circuit board according to the embodiment, and is a schematic enlarged cross-sectional view illustrating a state in which a light emitting device is loaded to the printed wiring board.

A method of manufacturing the printed circuit board will be described with reference to FIG. 4, FIGS. 5A to 5G, and FIGS. 3A, 3B. FIG. 4 is a schematic flowchart illustrating a flow of the manufacturing method of the printed circuit board according to the embodiment. FIG. 5A is a schematic explanatory view of a metal film forming step in the manufacturing method of the printed circuit board according to the embodiment, and is a schematic enlarged cross-sectional view illustrating a state in which a metal film is provided on one surface of a substrate. FIG. 5B is a schematic explanatory view of the metal film forming step in the manufacturing method of the printed circuit board according to the embodiment, and is a schematic enlarged cross-sectional view illustrating a state in which the metal film on the substrate is formed into a predetermined shape. FIG. 5C is a schematic explanatory view of a boring step in the manufacturing method of the printed circuit board according to the embodiment, and is a schematic enlarged cross-sectional view illustrating a state in which the metal film has a through-hole communicating with the through-hole of the substrate to form a via. FIG. 5D is a schematic explanatory view of a conductive-member filling step in the manufacturing method of the printed circuit board according to the embodiment, and is a schematic enlarged cross-sectional view illustrating a state in which a conductive member is filled in the vias in which the metal film has a through-hole communicating with the through-hole of the substrate. FIG. 5E is a schematic explanatory view of a wiring forming step in the manufacturing method of the printed circuit board according to the embodiment, and is a schematic enlarged cross-sectional view illustrating a state in which the wiring is formed on the other surface of the substrate. FIG. 5F is a schematic explanatory view of a mounting step in the manufacturing method of the printed circuit board according to the embodiment, and is a schematic enlarged cross-sectional view illustrating a state in which conductive bonding members are stuck to the printed wiring board. FIG. 5G is a schematic explanatory view of the mounting step in the manufacturing method of the printed circuit board according to the embodiment, and is a schematic enlarged cross-sectional view illustrating a state in which the light emitting device is loaded to the printed wiring board.

The method of manufacturing the printed circuit board includes metal film forming steps S11, S12 for forming the pads 4 each having a predetermined shape with a metal film on one surface of the substrate 11, a boring step S13 for forming the vias 11v serving as through-holes each of which through the corresponding pad 4 and the substrate 11, a conductive member filling step S14 for filling the conductive member 3 in the vias 11v, a wiring forming step S16 for forming the wiring 2 with a conductive film in portions including regions facing the vias 11v on the other surface of the substrate 11, and a mounting step S20 for bonding the leads 7a, 7c serving as the element terminals of the light emitting device 60 to the pads 4 with the bonding member 5. Further herein, a supporting film peeling step S15 is performed after the conductive member filling step S14 and before the wiring forming step S16. In addition, a protective film forming step S17 for forming the protective film 12 on the other surface of the substrate 11 is performed after the wiring forming step S16. The steps S11 to S17 correspond to a printed wiring board manufacturing step S10 for manufacturing the printed wiring board 1. Hereinafter, each step will be described in detail.

Metal-Film Multilayer Substrate Preparation Step and Pad Forming Step

A metal-film multilayer substrate preparation step S11 and a pad forming step S12 are series steps for forming the pads 4 on the one surface of the substrate 11. The metal-film multilayer substrate preparation step S11 is a step of preparing the substrate 11 in which a metal film such as copper foil is laminated on the one surface thereof. The copper foil is bonded to the substrate 11 with an adhesive or through thermocompression bonding, for example. In this substrate 11, to allow ease of work, as illustrated in FIG. 5A, the supporting film 14 that is formed from, for example, polyethylene terephthalate (PET) and is non-elastic (low elasticity) is bonded on a surface opposite to the surface (an upper side in FIG. 5A) on which the copper foil (denoted by being attached with a sign "4" in FIG. 5A) is laminated in a peelable state. The pad forming step S12 is a step of forming the copper foil into a shape of the pad 4 (refer to FIG. 5B). For example, a wiring forming method in manufacturing of a flexible printed wiring board having wiring formed from the copper foil can be applied to the pad forming step S12. Specifically, a resist mask (not illustrated) covering regions to be formed with the pads 4 is formed on the copper foil, and the copper foil covering a region excluding the pads 4 is removed by etching. The resist mask is then removed.

Boring Step

The boring step S13 is a step of boring holes in the pads 4 and the substrate 11, and forming the vias 11v in which the corresponding pad 4 has a through-hole communicating with the through-hole of the substrate, as illustrated in FIG. 5C. Similarly to via formation in manufacturing of the flexible printed wiring board, for example, the boring step S13 uses a numerical-control (NC) drill or a laser to bore the holes such that the corresponding pad 4 has a through-hole communicating with the through-hole of the substrate 11, or further communicating with the through-hole of the supporting film 14.

Conductive Member Filling Step

The conductive member filling step S14 is a step of forming the conductive members 3 by filling a conductive paste in each via 11v in which the corresponding pad 4 has a through-hole communicating with the through-hole of the substrate 11 as illustrated in FIG. 5D. The conductive paste is stuck on regions formed with the vias 11v on the pad 4 through a method corresponding to the conductive paste for screen printing or a dispenser, for example, and is then embedded into the vias 11v from one surface side. The conductive paste in vias 11v is then heated at a predetermined temperature and time according to the conductive paste in, for example, a furnace, and is cured to form the conductive member 3.

Supporting Film Peeling Step and Wiring Forming Step

The supporting film peeling step S15 is a step of peeling off the supporting film 14 bonded to the other surface of the substrate 11 to cause the other surface of the substrate 11 to be exposed. The wiring forming step S16 is a step of forming the wiring 2 with a conductive paste having elasticity on the other surface of the substrate 11 as illustrated in FIG. 5E. The pattern of the wiring 2 is formed with the screen printing or other methods.

Protective Film Forming Step

The protective film forming step S17 is a step of forming the protective film 12 on the other surface of the substrate 11 to cover the wiring 2. In the protective film forming step S17, the protective film 12 previously formed into a film shape may be bonded to the substrate 11 with an adhesive having elasticity, or a paint for the protective film 12 may be applied on the substrate 11 and dried. Through those steps, the printed wiring board 1 illustrated in FIGS. 3A, 3B can be obtained.

Mounting Step

In the mounting step S20, as illustrated in FIG. 5F, a conductive paste for the bonding members 5 is first stuck to a surface of each pad 4 of the printed wiring board 1 through the method corresponding to the conductive paste for the screen printing and the dispenser, for example, similarly to the conductive member filling step S14 (S21). Next, as illustrated in FIG. 5G, the light emitting device 60 is loaded such that the leads 7a, 7c on a lower surface of the light emitting device 60 and the pads 4 are aligned in position, and the conductive paste is cured (S22).

Deformation of Printed Circuit Board

Figure 6A:
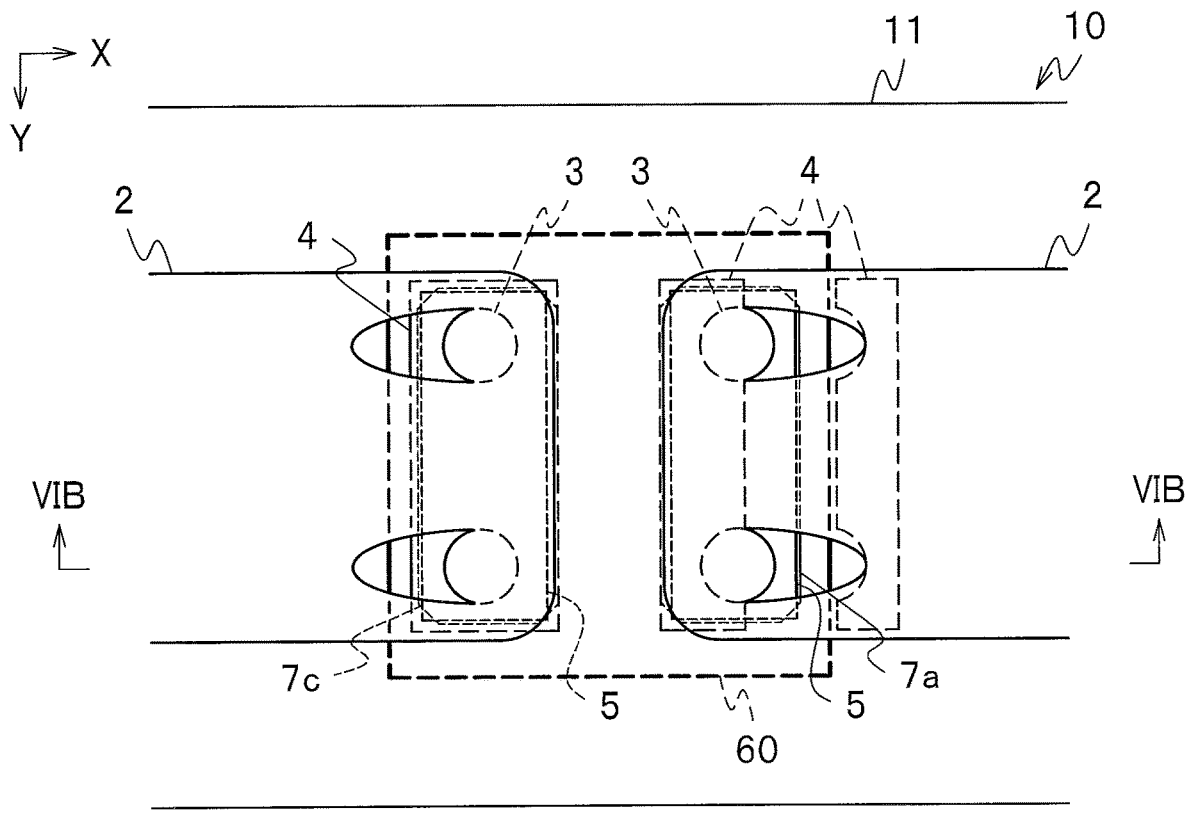
FIG. 6A is a schematic enlarged bottom view illustrating a state of the stretched printed circuit board according to the embodiment.
Figure 6B:
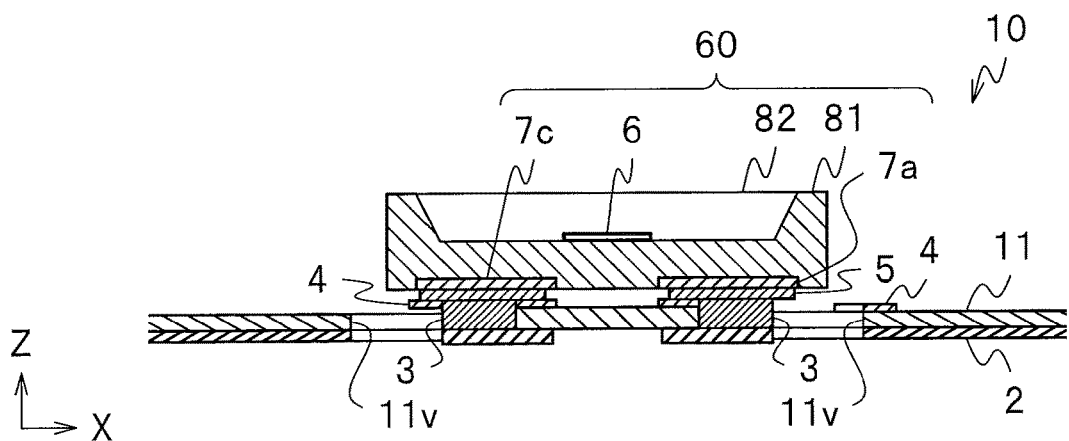
FIG. 6B is a schematic cross-sectional view taken along line VIB-VIB in FIG. 6A.

A state when the printed circuit board is deformed will be described with reference to FIGS. 6A, 6B and FIGS. 2A, 2B. FIG. 6A is a schematic enlarged bottom view illustrating a state of the stretched printed circuit board according to the embodiment. FIG. 6B is a schematic cross-sectional view taken along line VIB-VIB in FIG. 6A.

In the printed circuit board 10, regions formed with two bonding members 5 to be respectively bonded to the leads 7a, 7c of the light emitting device 60 and a region interposed by those two bonding members 5 are fixed. Those fixed regions are referred to as a mounting region of the light emitting device 60. When the printed circuit board 10 is bent at a position near the mounting region, the printed circuit board 10 is bent along one side of edges of the mounting region, and therefore stress concentrates on an upper surface of this one side. However, the wiring 2 is formed on a lower surface side, and therefore the wiring 2 is hardly damaged due to the interposed substrate 11 serving as a cushion. Further the stress propagates from this one side to the adjacent conductive members 3. However, since the conductive members 3 are disposed at two positions in an X direction and at two positions in a Y direction, stress concentration is dispersed, a load imposed on one conductive member 3 is decreased, and this conductive member 3 is surrounded by the substrate 11. Further the conductive members 3 are disposed immediately below the leads 7a, 7c, and therefore have high strength. Accordingly the conductive member 3 is hardly displaced and damaged, and the wiring 2 bonded to a lower end of the conductive member 3 as well as the bonding member 5 bonded to an upper end of the conductive member 3 are hardly peeled off from the conductive member 3. As a result, connection between the leads 7a, 7c and the wiring 2 can be kept.

Further, when the printed circuit board 10 is stretched by, for example, being pulled, the fixed mounting region of the printed wiring board 1 is not stretched, and regions excluding the mounting region are stretched instead. However, when the printed circuit board 10 is pulled by stronger force that exceeds bonding strength between the substrate 11 and the non-elastic conductive member 3 or the pad 4, the substrate 11 is partly peeled off as illustrated in FIGS. 6A, 6B, and the printed wiring board 1 is stretched also in the mounting region. In FIGS. 6A, 6B, the printed circuit board 10 stretched along the X direction is illustrated, and the protective film 12 is omitted. The conductive members 3 disposed at two positions on the substrate 11, which is the elastic member of the printed wiring board 1, along a stretching direction (X direction) fixes an inside portion interposed between the two conductive members 3 in the substrate 11. Therefore, a half of the substrate 11 along a peripheral surface of the via 11v on an outer side in the X direction is peeled off from the conductive member 3, and the via 11v deforms to be stretched outward. In other words, the inside portion of the substrate 11, which is interposed between the conductive members 3 and 3, is not deformed. Further, the wiring 2 that is the elastic member similarly to the substrate 11 serves to keep bonding to the substrate 11. As a result, the wiring 2 is broken along the outer half of the peripheral surface of the via 11v (conductive member 3) in the X direction, and the broken outside portion is stretched together with the substrate 11. In contrast, an inner-side portion of the broken portion in the wiring 2 keeps bonding to the conductive member 3, and is connected to the outside of the mounting region through the inside portion interposed between conductive members 3 and 3. This keeps connection between the wiring 2 and the conductive member 3, and further the bonding member 5 and the leads 7a, 7c. In other words, as long as the inside portion and the outside portion of the wiring 2 are not completely divided, the connection can be kept. Note that the pad 4 on a left side (a side of lead 7c) in FIGS. 6A, 6B is peeled off from the substrate 11. On the other hand, the pad 4 on a right side (a side of lead 7a) in FIGS. 6A, 6B is peeled off from the bonding member 5, and is divided in the X direction while being broken with the via 11v due to the stretched substrate 11. However, those cases do not affect bonding between the conductive member 3 and the bonding member 5, and therefore the connection between the wiring 2 and the leads 7a, 7c is similarly kept.
Modification The printed circuit board is not limited to the above-described configuration, and may be formed in the following manners.

The pad 4 can be formed from the conductive paste similarly to the conductive member 3 and the bonding member 5, and in this case, a pattern for the pad 4 is preferably formed with the screen printing. Alternatively, the pad 4 may be formed the conductive paste being applied through the screen printing or an ink-jet method, then be thickened with copper plating.

Similarly to the wiring 2, the conductive member 3 can be formed from the elastic conductive paste. Accordingly, after the boring step S13, the wiring forming step S16 is performed instead of the conductive member filling step S14, and the conductive paste is filled in the via 11v from the other surface side of the substrate 11 simultaneously with formation of the wiring 2. The conductive member 3 can thus be formed. Such a conductive member 3 tends to have lower elasticity than the wiring 2 due to, for example, its shape (a diameter, a thickness). However when the printed wiring board 1 is bent, the conductive member 3 follows deformation of the substrate 11 to some extent, and uses the substrate 11 as a cushion. Therefore the conductive member 3 is more hardly damaged, and bonding with the wiring 2 and the bonding member 5 can be kept.

Figure 7:
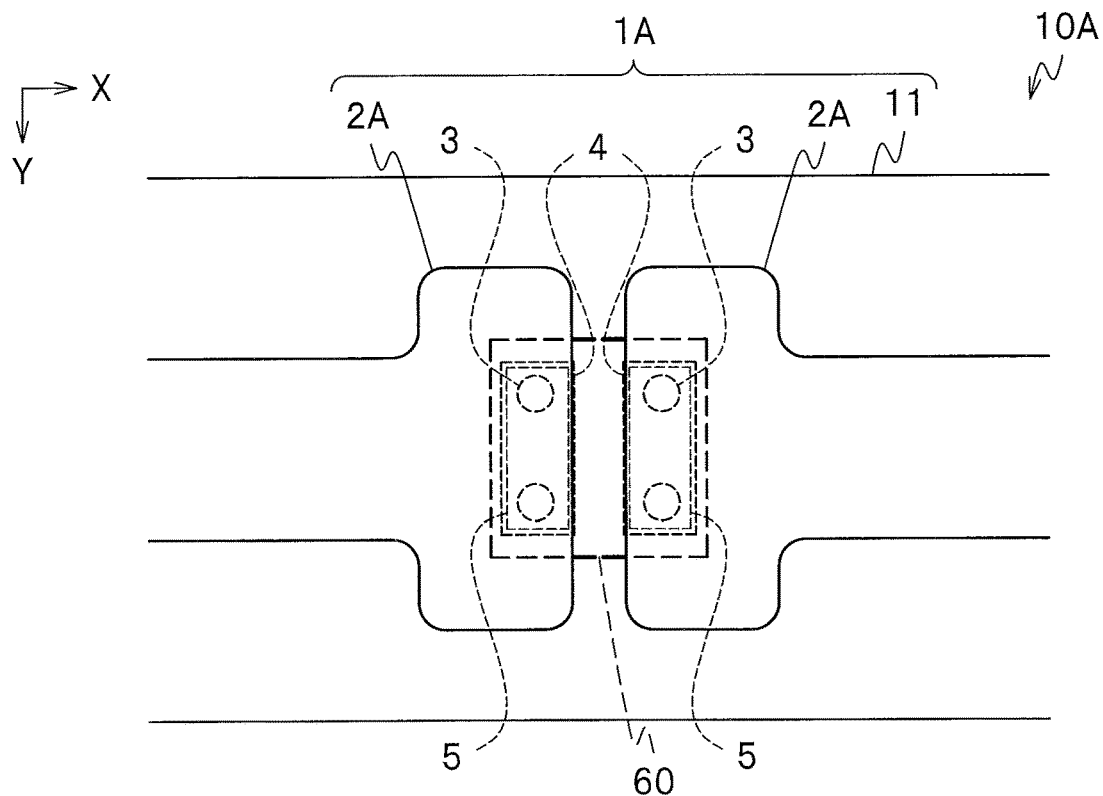
FIG. 7 is a schematic bottom view illustrating a configuration of a first modification of the printed circuit board according to the embodiment.
Figure 8:
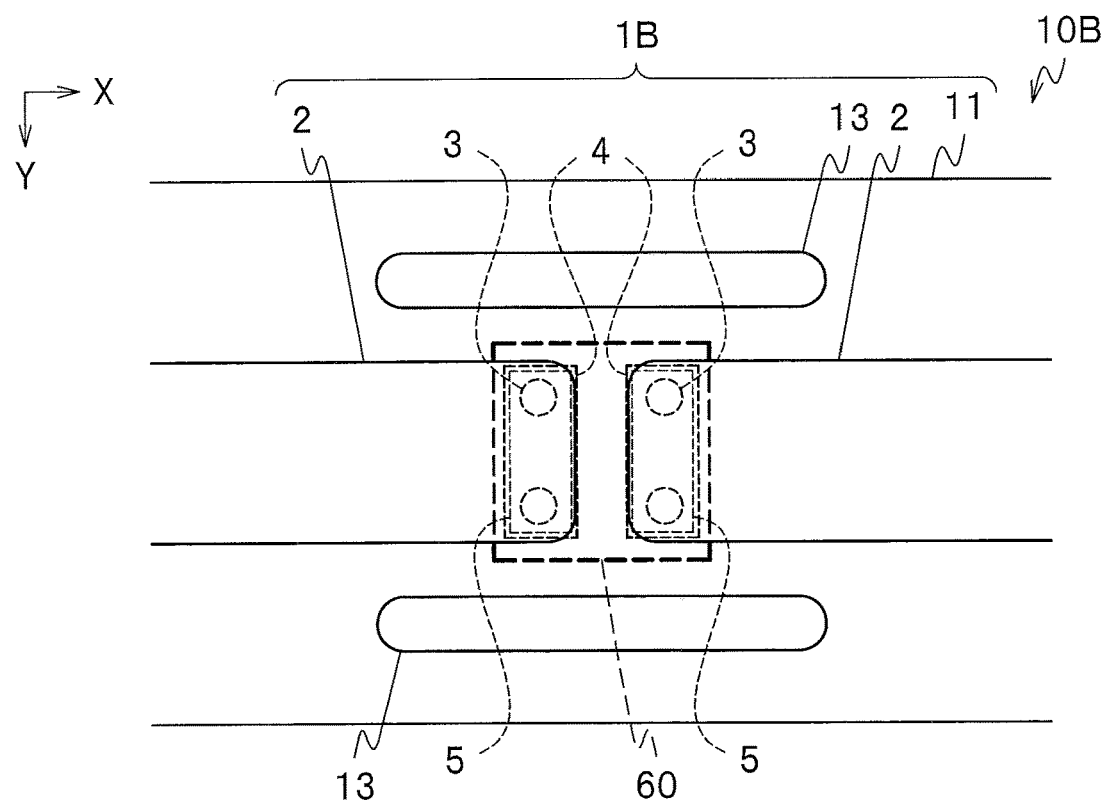
FIG. 8 is a schematic bottom view illustrating a configuration of a second modification of the printed circuit board according to the embodiment.
Figure 9:
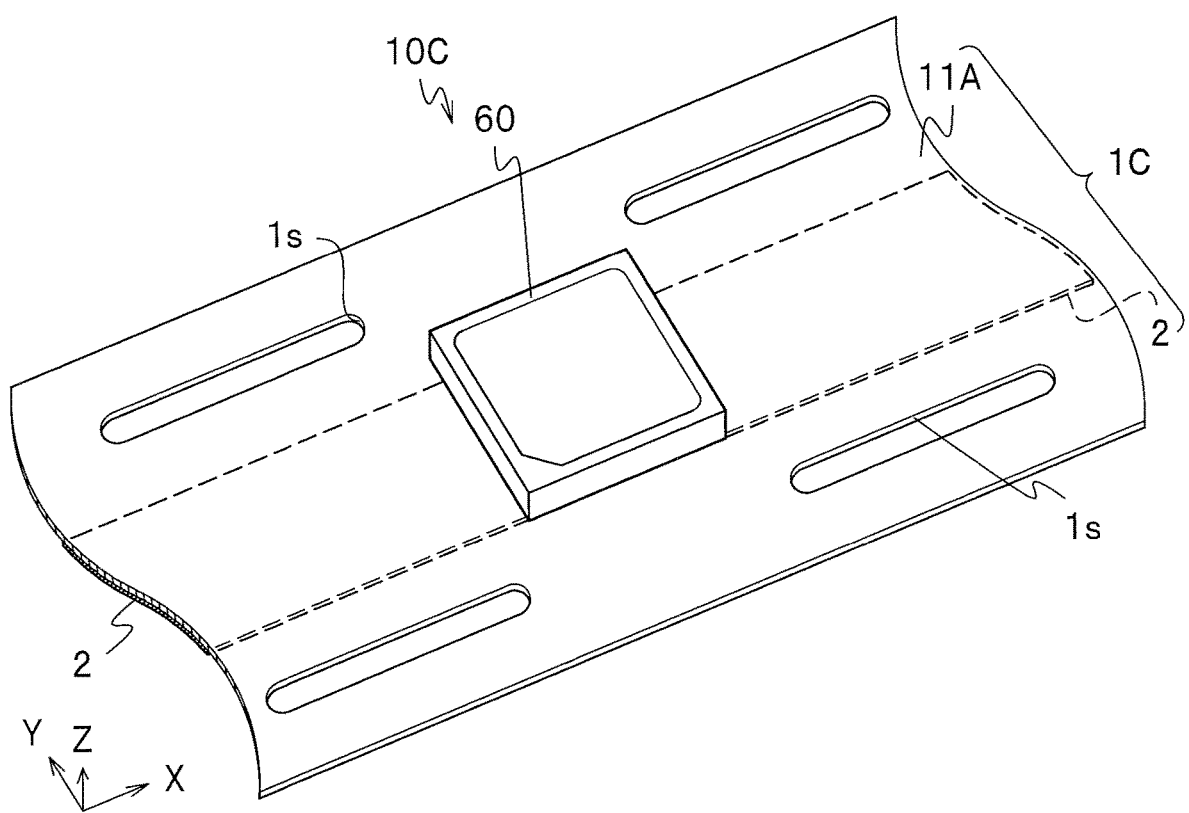
FIG. 9 is a schematic bottom view illustrating a configuration of a third modification of the printed circuit board according to the embodiment.

The protective film 12 only has to cover the wiring 2 entirely, and therefore the protective film 12 can be formed not to be disposed in a considerably wide region on which the wiring 2 is not formed. Such a protective film 12 can be formed with printing similarly to the wiring 2, for example. With this configuration, in the printed circuit board 10, a region provided with no protective film 12, that is, a region provided with only the substrate 11 is easily deformed or stretched relatively, whereby the wiring 2 is prevented from being deformed and is thus hardly damaged. Further the mounting region on which the protective film 12 is disposed and the vicinity thereof are also hardly deformed, thereby keeping the connection with the light emitting device 60 more reliably.
Modification When the printed circuit board is formed to cause the printed wiring board to be hardly deformed relatively in the mounting region and the vicinity thereof, the connection with the light emitting device can be more easily kept, thereby improving reliability more. Hereinafter, other configurations of the printed circuit board will be described with reference to FIG. 7, FIG. 8, and FIG. 9. FIG. 7 is a schematic bottom view illustrating a configuration of a first modification of the printed circuit board according to the embodiment. FIG. 8 is a schematic bottom view illustrating a configuration of a second modification of the printed circuit board according to the embodiment. FIG. 9 is a schematic bottom view illustrating a configuration of a third modification of the printed circuit board according to the embodiment.
First Modification As illustrated in FIG. 7, a printed circuit board 10A includes a printed wiring board 1A, the light emitting device 60 mounted on the printed wiring board 1A, and the bonding members 5. The printed wiring board 1A includes wiring 2A instead of the wiring 2 of the above-described printed wiring board 1. In the wiring 2A, portions bonded to the conductive members 3 in a shape in plan view (bottom view) are formed large beyond an outer circumference of the light emitting device 60. With this configuration, in the printed circuit board 10A, a mounting region of the printed wiring board 1A and the vicinity thereof are thickened and widened with the wiring 2A. Therefore the printed circuit board 10A is hardly deformed or stretched in comparison with the printed wiring board 1 including the wiring 2. The widened wiring 2A is more hardly divided, thereby keeping the connection with the light emitting device 60 more reliably. The wiring 2A may be formed large in a range between both ends of the printed wiring board 1A in the Y direction.
Second Modification Next, as illustrated in FIG. 8, a printed circuit board 10B includes a printed wiring board 1B, the light emitting device 60 mounted on the printed wiring board 1B, and the bonding members 5. The printed wiring board 1B further includes low-elastic members 13 in the above-described printed wiring board 1. In plan view, the low-elastic members 13 are disposed parallel to each other at two positions facing each other along the Y direction with the light emitting device 60 interposed. The low-elastic members 13 are each formed in an elongated shape to protrude toward both outer sides of the light emitting device 60 in the X direction. The low-elastic members 13 only have to be members whose elasticity is lower than that of the substrate 11 and the wiring 2. Further, the low-elastic members 13 may be formed thick with the same material as those of substrate 11 and wiring 2. With this configuration, in the printed circuit board 10B, the mounting region and the vicinity thereof of the printed wiring board 1B are difficult to stretch along the X direction, thereby keeping the connection with the light emitting device 60 more reliably. Note that the low-elastic members 13 may be provided on any one of one surface side and the other surface side of the printed wiring board 1B. Accordingly, for example, the low-elastic members 13 can be formed with the same conductive paste as the wiring 2 simultaneously with the wiring 2 on the other surface side of the printed wiring board 1B, or can be formed simultaneously with the bonding member 5 on the one surface side of the printed wiring board 1B.
Third Modification As illustrated in FIG. 9, a printed circuit board 10C includes a printed wiring board 1C and the light emitting device 60 mounted on the printed wiring board 1C. In the printed wiring board 1C, in plan view, slit holes 1s parallel to each other are formed at positions other than two positions facing each other with the light emitting device 60 interposed. The light emitting device 60 includes the semiconductor light emitting element 6 or the light emitting element 6 that is a semiconductor element. In other words, in the printed wiring board 1C, the slit holes 1s parallel to each other are formed in a region without the light emitting device 60 interposed. The printed wiring board 1C corresponds to the printed wiring board 1 in which the slit holes 1s are formed. Note that the bonding member 5, and the conductive member 3 and the pad 4 in the printed wiring board 1C are omitted herein (refer to FIGS. 2A, 2B). One slit hole 1s or two or more slit holes 1s can be provided. However, the slit holes is are preferably provided as a pair or two or more pairs to be parallel to each other. In the printed wiring board 1C, regions other than two positions facing each other with the light emitting device 60 interposed have higher elasticity along the X direction than two positions facing each other along the Y direction with the light emitting device 60 interposed. In the printed wiring board 1C, regions formed with the slit holes 1s can have higher elasticity than regions formed with no slit hole 1s. The slit holes 1s are each formed in an elongated shape in the X direction, and in plan view, the slit holes 1s are disposed at four positions in total outside the light emitting device 60 and facing each other along the Y direction with the wiring 2 interposed, to be two sets of two positions parallel to each other. In the printed wiring board 1C, the slit holes 1s are preferably formed in regions on which the light emitting device 60 is not present. Therefore the slit holes 1s are formed to penetrate the substrate 11A and the protective film 12 (refer to FIG. 2B). The shape of each slit hole 1s is not limited to be elongated in one direction, and holes each having a shape such as a circle, a rectangle, or an ellipse may be aligned in a dashed line. With those configurations, in the printed circuit board 10C, regions interposed between the slit holes 1s and 1s are easily deformed or stretched relatively. In contrast, regions near the light emitting device 60 are reduced to be deformed or stretched. Therefore the connection with the light emitting device 60 can be kept more reliably.

The printed circuit board may include a printed wiring board formed by combining the configurations of the printed wiring boards 1A, 1B, and 1C. For example, when the configurations of the printed wiring board 1A and the printed wiring board 1B are combined, the low-elastic members 13 are provided on both outer sides interposing wiring 2A in plan view. Further, when the configurations of printed wiring board 1A or printed wiring board 1B and printed wiring board 1C are combined, the slit holes 1s are formed in regions other than two positions facing each other with the light emitting device 60 as well as the wiring 2A or the low-elastic members 13 interposed in plan view.

For the wiring 2, a low-elastic material having relatively high conductivity, such as the metal foil of the pad 4 or the conductive paste of the bonding member 5, can be used. In this case, the wiring 2 is formed in, for example, a meandering wiring pattern so as to correspond to stretch of the printed wiring board 1.

When the printed circuit board 10 (10A, 10B, 10C) is a flexible circuit board requiring no elasticity, a low-elastic film-shaped base material is used for the substrate 11. Examples of the substrate 11 include polyimide (PI), polyphenylene sulfide, polyethylene terephthalate (PET), polyethylene naphthalate (PEN), a liquid crystal polymer, polyethylene, polypropylene, a glass epoxy resin, and paper. Also for the wiring 2, the above-described low-elastic material is used.

In the printed circuit board 10 (10A, 10B, 10C), the printed wiring board 1 may have a double-sided wiring structure in which the wiring 2 is provided in regions excluding the mounting region and the vicinity thereof on the one surface side. In this case, the printed wiring board 1 preferably has the protective film 12 also on the one surface side.

Printed Circuit Board

Figure 10A:
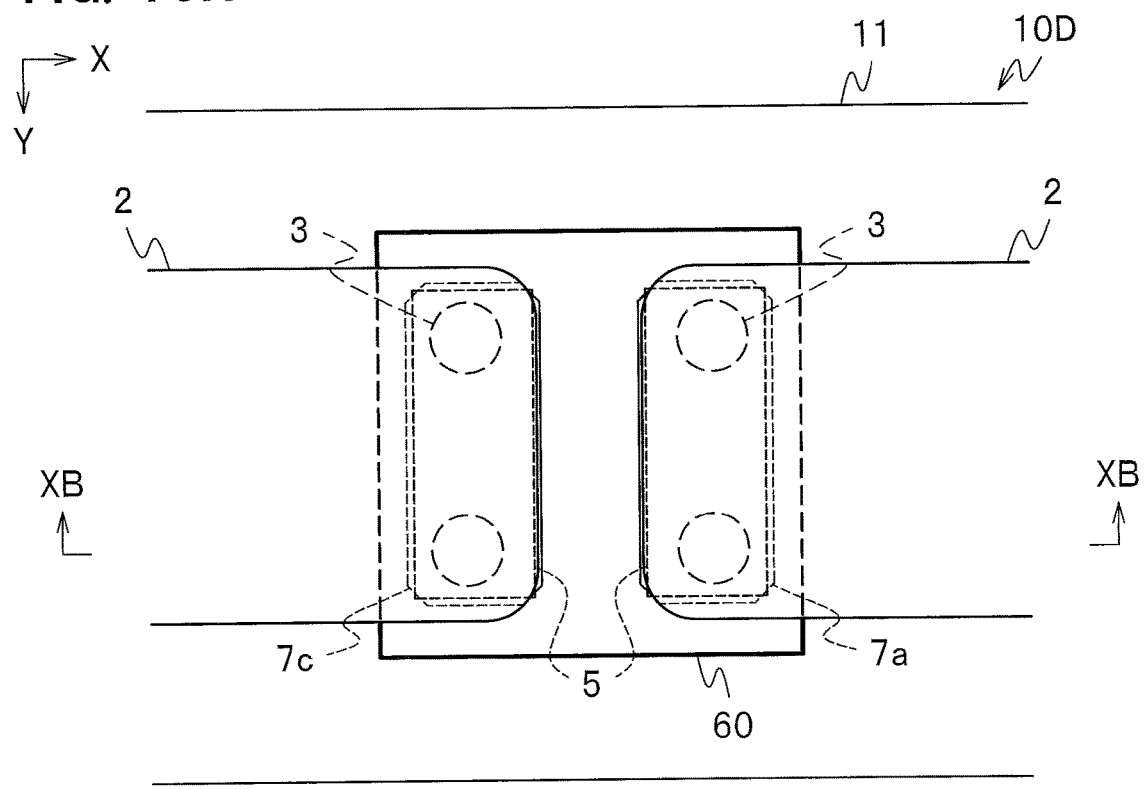
FIG. 10A is a schematic enlarged bottom view illustrating another configuration of the printed circuit board according to the embodiment.
Figure 10B:
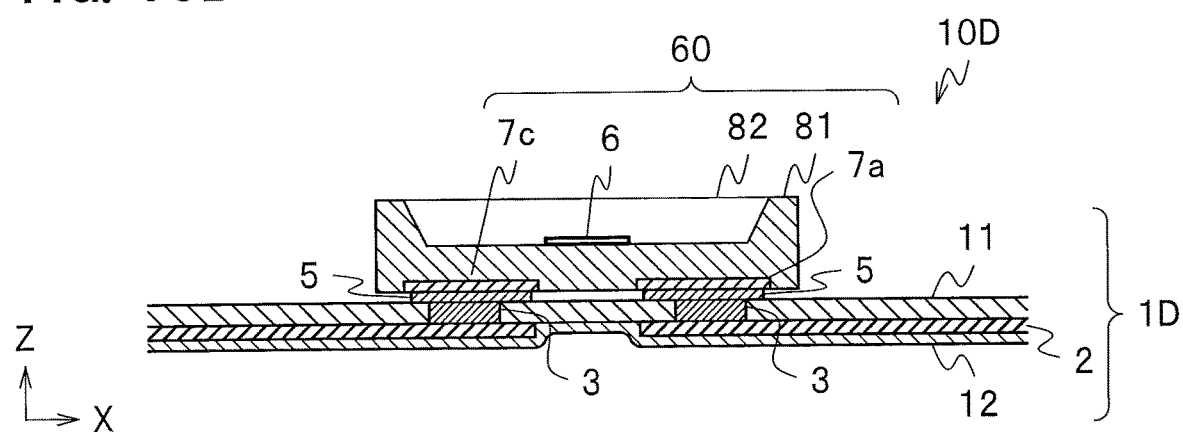
FIG. 10B is a schematic cross-sectional view taken along line XB-XB in FIG. 10A.

Each of the above-described printed circuit boards includes the pads formed from the metal film on the printed wiring board for mounting the light emitting device, but can have a structure without the pads. Hereinafter, another configuration of the printed circuit board will be described with reference to FIGS. 10A, 10B. FIG. 10A is a schematic enlarged bottom view illustrating the other configuration of the printed circuit board according to the embodiment. FIG. 10B is a schematic cross-sectional view taken along line XB-XB in FIG. 10A.

The printed circuit board 10D includes a printed wiring board 1D with the wiring 2 disposed on a surface of the insulative substrate 11 having flexibility and elasticity, the light emitting device 60 that is a semiconductor element to be mounted on the printed wiring board 1D through the leads 7a, 7c that are element terminals, and the bonding members 5. The printed wiring board 1D is formed by eliminating the pads 4 from the above-described printed wiring board 1, and therefore the bonding members 5 are bonded to the conductive members 3 filled in vias 11v of the substrate 11 and one surface of the substrate 11. Therefore, in the printed wiring board 1D, the bonding members 5 are preferably provided with wide areas in particular, and a material having high adhesivity also to the substrate 11 is selected. Note that, in FIG. 10A, assuming that the substrate 11 is transparent, illustration is made so as to show the light emitting device 60 disposed on an upper side (a deep side of the paper) of the substrate 11.

Method of Manufacturing Printed Circuit Board

In a method of manufacturing the printed circuit board 10D, steps excluding the metal-film multilayer substrate preparation step S11 and the pad forming step S12 in the method of manufacturing the printed circuit board 10 are performed (refer to FIG. 4). Further, in the method of manufacturing the printed circuit board 10D, the substrate 11 whose one surface is bonded with non-elastic supporting film 14 in a peelable manner can be used, as described in the metal-film multilayer substrate preparation step S11 of the printed circuit board 10. Here a side bonded with the supporting film 14 serves as the mounting surface of the light emitting device 60. Accordingly in the boring step S13, holes are bored in the substrate 11 and the supporting film 14 to form the vias 11v in which the supporting film 14 has a through-hole communicating with the through-hole of the substrate 11. Further in the conductive member filling step S14, the conductive paste is embedded in the vias 11v to form the conductive members 3. The supporting film peeling step S15 is performed before the mounting step S20 to peel off the supporting film 14 and to cause the substrate 11 to be exposed. In the mounting step S20, the conductive paste is applied to the conductive members 3 on a surface opposite to the wiring 2, and the substrate 11 around the conductive members 3 on the printed wiring board 1D, according to disposition and shapes of the leads 7a, 7c of the light emitting device 60 (S21). The light emitting device 60 is then loaded such that the leads 7a, 7c on a lower surface of the light emitting device 60 and the conductive paste are aligned in position, then the conductive paste is cured (S22).

Change when Printed Circuit Board is Stretched

Similarly to the printed circuit board 10, when the printed circuit board 10D is bent at a portion near the mounting region, the conductive members 3 are not broken because the substrate 11 around the conductive members 3 serves as a cushion. In addition, the conductive members 3 are hardly peeled off from the wiring 2 and bonding members 5. Accordingly, connection between the leads 7a, 7c and the wiring 2 can be kept. Similarly to the printed circuit board 10 illustrated in FIGS. 6A, 6B, when the printed circuit board 10D is stretched by being strongly pulled, a portion of the substrate 11 corresponding to a half of a peripheral surface of the via 11v on an outer side in the X direction is peeled off from the conductive member 3, and the via 11v is deformed to stretch outward. As a result, the wiring 2 is broken along the outer half of the peripheral surface of the via 11v in the X direction. At this time, the bonding member 5 is peeled off from the substrate 11, but bonding of the bonding member 5 and the conductive member 3 is kept. Therefore, the connection between the wiring 2 and the leads 7a, 7c is similarly kept.

Modification

Similarly to the printed circuit boards 10A, 10B, 10C according to the above-described modifications, the printed circuit board 10D may cause the printed wiring board 1D to include the wiring 2A formed large, to include the low-elastic members 13, or to be formed with the slit holes 1s. It is possible that the low-elastic material is applied to the wiring 2, and the wiring 2 is formed into a meandering wiring pattern. Further, the printed circuit board 10D can be the flexible circuit board requiring no elasticity.

As described above, the printed circuit board according to the embodiment of the present disclosure can keep the connection with the semiconductor device such as the light emitting device even when being deformed or being stretched or contracted, by mounting the semiconductor device through the columnar conductive member provided in the via penetrating the substrate.

The printed circuit board according to the present disclosure can be used for a deformable and elastic device such as a wearable device.

Obviously, numerous modifications and variations of the present invention are possible in light of the above teachings. It is therefore to be understood that within the scope of the appended claims, the invention may be practiced otherwise than as specifically described herein.

What is claimed is:

1. A printed circuit board comprising:
   a printed wiring board comprising:
      an insulative substrate having a first surface and a second surface opposite to the first surface, the insulative substrate having flexibility and through-holes passing through the insulative substrate from the first surface to the second surface; and
      wiring provided on the second surface of the insulative substrate to face the through-holes;
   a semiconductor element mounted on the first surface of the insulative substrate of the printed wiring board and having element terminals interposed between the printed wiring board and the semiconductor element; and
   conductive members filled in the through-holes connecting the element terminals and the wiring,
   wherein the insulative substrate has elasticity in which an elongation percentage is set to be 20% or more,
   wherein the wiring includes a conductive polymer or the wiring includes an elastic conductive paste in which conductive particles are mixed into a resin material,
   wherein the printed wiring board includes a metal film in a region immediately below each of the element terminals on the first surface of the insulative substrate, the metal film having a through-hole communicating with the through-hole of the insulative substrate, and
   wherein the element terminal and the metal film are bonded to each other with a conductive bonding member.

2. The printed circuit board according to claim 1, wherein the elongation percentage of the insulative substrate is 900% or less.

3. The printed circuit board according to claim 1, wherein the element terminals and the conductive member are bonded to each other with the conductive bonding member.

4. The printed circuit board according to claim 1, wherein a gap between adjacent holes of the through-holes is more than or equal to a thickness of the insulative substrate.

5. The printed circuit board according to claim 1, wherein the conductive member is formed from an elastic conductive paste in which conductive particles are mixed into a resin material.

6. The printed circuit board according to claim 1, wherein ends of the wiring facing each other immediately below the semiconductor element are formed larger than an outer circumference of the semiconductor element in plan view.

7. The printed circuit board according to claim 1, wherein the printed wiring board has, at each of two positions facing each other with the semiconductor element interposed therebetween in plan view, a member having an elongated shape and having elasticity lower than that of the insulative substrate and the wiring, the members being parallel to each other.

8. The printed circuit board according to claim 1, wherein the printed wiring board has, in plan view, slit holes parallel to each other in regions without the semiconductor element interposed therebetween, excluding regions facing each other with the semiconductor element or a light emitting device on which the semiconductor element is mounted interposed between the regions.

9. The printed circuit board according to claim 1, wherein a plurality of the through-holes are formed with respect to each of the element terminals.

10. The printed circuit board according to claim 1, wherein the semiconductor element is a light emitting element.

11. The printed circuit board according to claim 1, wherein the insulative substrate is elastomer.

12. The printed circuit board according to claim 1, wherein the insulative substrate is silicone-based polymer or urethane-based polymer.

13. The printed circuit board according to claim 1, wherein a diameter of each of the through-holes is more than or equal to a minimum wiring width in the printed wiring board.

14. A printed circuit board comprising:
   a printed wiring board comprising:
      an insulative substrate having a first surface and a second surface opposite to the first surface, the insulative substrate having flexibility and through-holes passing through the insulative substrate from the first surface to the second surface; and
      wiring provided on the second surface of the insulative substrate to face the through-holes;
   a semiconductor element mounted on the first surface of the insulative substrate of the printed wiring board and having element terminals interposed between the printed wiring board and the semiconductor element; and
   conductive members filled in the through-holes connecting the element terminals and the wiring,
   wherein the insulative substrate has elasticity in which an elongation percentage is set to be 20% or more,
   wherein the wiring includes a conductive polymer or the wiring includes an elastic conductive paste in which conductive particles are mixed into a resin material,
   wherein the insulative substrate has additional through-holes passing through the insulative substrate from the first surface to the second surface, and
   wherein the printed wiring board further comprises additional wiring provided on the second surface of the insulative substrate to face the additional through-holes.

15. A printed circuit board comprising:

a printed wiring board comprising:
- an insulative substrate having a first surface and a second surface opposite to the first surface, the insulative substrate having flexibility and through-holes passing through the insulative substrate from the first surface to the second surface; and
- wiring provided on the second surface of the insulative substrate to face the through-holes;

a semiconductor element mounted on the first surface of the insulative substrate of the printed wiring board and having element terminals interposed between the printed wiring board and the semiconductor element; and conductive members filled in the through-holes connecting the element terminals and the wiring, wherein the insulative substrate has elasticity in which an elongation percentage is set to be 20% or more, wherein the wiring includes a conductive polymer or the wiring includes an elastic conductive paste in which conductive particles are mixed into a resin material, wherein the semiconductor element is a light emitting element, wherein the insulative substrate has additional through-holes passing through the insulative substrate from the first surface to the second surface, wherein the printed wiring board further comprises additional wiring provided on the second surface of the insulative substrate to face the additional through-holes, wherein the semiconductor element has a pair of element terminals, and wherein the element terminals are connected to the wiring and the additional wiring via the conductive members, respectively.

* * * * *